United States Patent [19]

Ferris

[11] Patent Number: 5,734,608
[45] Date of Patent: Mar. 31, 1998

[54] RESIDUAL CHARGE ELIMINATION FOR A MEMORY DEVICE

[75] Inventor: Andrew Ferris, Milan, Italy

[73] Assignee: SGS-Thomson Microelectronics Limited, Bristol, United Kingdom

[21] Appl. No.: 580,549

[22] Filed: Dec. 29, 1995

[30] Foreign Application Priority Data

Dec. 29, 1994 [GB] United Kingdom ............... 9426337

[51] Int. Cl.$^6$ ................................................. G11C 11/34
[52] U.S. Cl. ........................... 365/185.05; 365/230.06
[58] Field of Search ...................... 365/185.05, 185.33, 365/230.06–230.08, 206, 233.5; 326/105, 106

[56] References Cited

U.S. PATENT DOCUMENTS

| | | | |
|---|---|---|---|
| 5,016,216 | 5/1991 | Ali | 365/185.05 |
| 5,491,658 | 2/1996 | Schreck | 365/230.06 |
| 5,511,032 | 4/1996 | Kammerev | 365/230.06 |
| 5,602,796 | 2/1997 | Sugio | 365/230.06 |

FOREIGN PATENT DOCUMENTS

| | | | |
|---|---|---|---|
| 0 257 912 A3 | 3/1988 | European Pat. Off. | G11C 11/40 |
| 0 572 240 A2 | 12/1993 | European Pat. Off. | G11C 16/06 |

OTHER PUBLICATIONS

"High Density Memory Selection Circuit," *IBM Technical Disclosure Bulletin* 15, (7): 2042–2044, Dec. 1972.

*Primary Examiner*—A. Zarabian
*Attorney, Agent, or Firm*—David V. Carlson; Bryan A. Santarelli; Seed and Berry LLP

[57] ABSTRACT

A circuit and method is provided for addressing memory cells in a memory device, including two series connected select gates having a node between them. A switching element is connected between the node and a ground voltage. A control signal is applied to a control input of the switching element to render it conductive while both of the select gates are non-conductive, so as to eliminate charge stored at a node between the two select gates. A particular application to an addressing circuit for use in a flash EPROM memory device is described.

16 Claims, 5 Drawing Sheets

RESIDUAL CHARGE ELIMINATION FOR A MEMORY DEVICE

TECHNICAL FIELD

The present invention concerns a circuit and method for addressing memory cells in a memory device. Although the current invention finds application in many fields, it has particular advantages when used in memory devices such as flash EPROM memory devices.

BACKGROUND OF THE INVENTION

FIG. 1 shows circuitry for controlling a flash EPROM memory cell. The memory cell 2 comprises a single N-channel transistor 4, having a control gate CG and a floating 10 gate FG, a source S and a drain D. The source S is connected either to a ground voltage $V_{GND}$, or to a programming voltage, $V_{PP}$, by a source voltage switch 8, according to a signal applied to an erase control input 10. The drain D of transistor 4 is connected to a bitline 12, which may be connected either to a sense amplifier circuit 14 via dataline DB or to a programmable load circuit 16 by bitline switch 18, according to a select signal 20. Select signal 20 is provided by a decoding circuit (not illustrated), according to applied column address signals. The programmable load circuit 16 is controlled by load control signals 22. The sense amplifier circuit 14 has an output to an output data line 24. The control gate of transistor 4 is connected through wordline 26 to a gate voltage switch 28. This permits the control gate CG to be connected to the ground voltage $V_{GND}$, the programming voltage $V_{PP}$, or a supply voltage $V'_{CC}$, according to control signals applied to program and erase control inputs 30 and 10 respectively. $V'_{CC}$ is 5 V for a memory device operating with a 5 V supply, and about 5 V for a memory device operating with a 3 V supply.

The flash memory cell 2 has three modes of operation.

In program mode, a logic 0 is written to the cell 2. The control gate CG is connected to the program voltage $V_{PP}$. The source S of transistor 4 is connected to the ground voltage $V_{GND}$. The drain D is connected to the programmable load circuit 16, programmed to place the drain D of transistor 4 at about 5 V. Thus, the floating gate FG is negatively charged, making the transistor less conductive for a given control gate voltage.

In erase mode, a logic 1 is written to the cell 2. In the erase mode, the control gate CG of the transistor 4 is connected to the ground voltage $V_{GND}$. The source S is connected to the program voltage $V_{PP}$. The bitline switch 18 is set to allow the bitline 12 to float at around IV. The negative charge on the floating gate FG is reduced, making the cell more conductive. After a sufficient time, the logic 1 is written into the cell 2.

In read mode, voltages are applied to transistor 4 such that a relatively low current will flow when a 0 has been written into the cell 2, and a relatively high current will flow when a 1 has been written into the cell 2. The contents of each memory cell 2 may thus be determined. The control gate CG and wordline 26 are connected to the supply voltage $V'_{CC}$ 10 by the gate voltage switch 28. The source S is connected to ground $V_{GND}$. Bitline 12 is connected to the sense amplifier circuit 14, which provides a bias of around IV. The sense amplifier 14 detects the level of the current and places the output dataline 24 in a logic state indicative of the state of the cell 2, by comparing the level of current with a reference level REF that is input to the circuit 14 via a line 32.

In a flash memory device, many cells such as cell 2 shown in FIG. 1 are connected together, and provided with addressing circuitry. Each cell, however, functions as described above, in its three possible states.

FIG. 2 shows a typical arrangement of M×N memory cells FM00 to FM(M-1)(N-1), within a flash EPROM memory device. Features identical to those in FIG. 1 have identical reference labels. Voltage supplies $V_{GND}$, $V_{PP}$, $V'_{CC}$ are not shown for clarity, but should be understood as being connected as in FIG. 1. Each cell FM may be identical to the cell 2 discussed above in conjunction with FIG. 1. The cells are arranged in M rows and N columns. The control gates of all cells FM in a row are connected together to one of M wordlines WL0 to WL0(M-1). A row line decode circuit 40 selectively addresses the wordlines WL in response to applied row address signals 42, to connect the required wordline 44 to the gate voltage switch 28. All cells FM in a column have their drains connected together, to one of N common bitlines, BL0 to BL(N-1). These common bitlines BL are connected to a column line decode circuit 46 which selectively addresses the bitlines BL in response to applied column address signals 48. The column line decode circuit comprises a plurality N of bit line switches 18 (not shown in FIG. 2), one connected to each bitline as in FIG. 1, plus decoding circuitry which applies select signals 20 (not shown in FIG. 2) to each of the bitline switches 18 in response to the applied column address signals 48. Sense amplifier and programmable load circuits 14 and 16 are respectively connected to the bitline switches 18 as in FIG. 1, and receive their respective reference and load control signals 32 and 22. The sense amplifier 14 again applies its output to output dataline 24.

When a particular memory cell is to be programmed, the address corresponding to the particular cell is applied in a suitable fashion to the row address signals 42 and the column address signals 48. The programmable load 16 will be applied to a selected column only, so that only the particular cell is programmed, although the programming voltage $V_{PP}$ be applied to the control gates CG of all the cells in a selected row. During program and read operations, certain signals are often applied to other cells in the array which are not selected, to improve the performance of the selected cell. During erase operations, every cell in the array is erased, or the array may be designed to allow certain portions only of the array to be erased.

In currently available flash EPROM memory devices, several select gates are used in the row line decode circuit 40 and the column line decode circuit 46. Such select gates may simply be MOS transistors. Use of several select devices in series allows the row line decode circuitry 40 and the column line decode circuitry 46 to be simplified significantly, as several small decoders may be used, each one controlling one of the series select gates. This results in a smaller, simpler design than would the use of a single large decoder controlling a single select gate per bitline.

The row address signals 42 and column address signals 48 are supplied by an address buffer 15, which receives an address input 16. An Address Transition Detect (ATD) circuit 17 is connected to the address input 16, preferably prior to the address buffer 15, and generates a low pulse $\overline{ATD}$ in response to detecting a transition in the address input. The $\overline{ATD}$ signal is passed to the column line decode circuit 46 and may be used as hereunder described in conjunction with FIG. 5. No chip enable signal is required for the production of an $\overline{ATD}$ pulse.

FIG. 3A shows a column decode sub-circuit as used in current flash EPROM devices. Column address signals Y are split into two sets of address signals, bitline select signals $Y_A$ and group select signals $Y_B$. The bitlines BL0 to BL(N–1) are split into a number of groups, each containing η bitlines. Illustrated in FIG. 3A are bitlines BL0 to BL(p–1), corresponding to a first group of η bitlines. N-channel transistors 70-0, 70-1, 70-2 represent select gates connected to bitlines BL0, BL1, BL2. N-channel transistor 70-(η–1) represents a select gate on a final bitline BL(η–1) of the group. The source terminals S of all transistors 70 in a group are connected together at a node 80. Their drain terminals D are respectively connected to bitlines BL0, BL1, BL2 and BL(η–1).

Gate terminals G of transistors 70 receive bitline select signals $Y_{A0}$, $Y_{A1}$, $Y_{A2}$, $Y_{A(p-1)}$, respectively. These are normally LOW, but change to a HIGH state for a period of time (the select period), during which conduction is required. Each of these select signals $Y_A$ thus selects one bitline from the group BL0 to BL(η–1)). An N-channel transistor 82 has its drain terminal D connected to node 80 and its gate terminal connected so as to receive a group select signal $Y_B$). Its source terminal S is connected to dataline DB, which corresponds to the input to the sense amplifier 14 of FIGS. 1 and 2. This transistor 82 represents a select gate for selecting the group of bitlines BL0 to BL(η–1). The number of groups of bitlines will be N/g so N/p group select signals, $Y_{B0}$ to $Y_{B(N/p-1)}$ are required.

In a flash EPROM circuit, many circuits such as that shown in FIG. 3A are connected to one data line DB in a data bus. Each will have a transistor 82 to select a group of η bitlines, supplied with a different group select signal $Y_B$ applied to a gate terminal.

FIG. 3B shows such an arrangement. Many circuits 84, 86, 88, each identical to the circuit of FIG. 3A, are connected to have an output (the source S of transistor 82) connected to the dataline DB, inputs (drains D of transistors 70) connected to bitlines BL and bitline select inputs (the gates G of transistors 70) connected to the bitline select signals $Y_{A0}$ to $Y_{A(p-1)}$. Each circuit 84, 86, 88 has a group select input (the gate G of transistor 82) connected to a corresponding one of the second set of column address select signals $Y_{B0}$, $Y_{B1}$, $Y_{B2}$. The first circuit 84 has inputs connected to receive the first group of η bitlines, BL0 to BL(p–1). Similarly, the second circuit 86 has inputs connected to receive the second group of η bitlines in address order, BLη to BL(2η–1); the third circuit 88 being connected to receive a third group of η bitlines BL(2η) to BL(3η–1). Further circuits may be connected in like manner to further bitlines.

The selection as to which bitline BL is connected to the dataline DB is made by a combination of first $Y_A$ and second $Y_B$ sets of column address select signals. A bitline to be connected to the dataline DB may be referenced by an eight bit address such as 0000 0010. Two four bit decoders may be used to decode the address, the first four bit decoder decoding a first set of four bits (0000) to provide a high group select signal on $Y_{B0}$, and the second four bit decoder decoding a second set of four bits (0010) to produce a high bitline select signal on $Y_{A2}$. Similar arrangements may be made for other address lengths.

This is the preferred decoding method, as addressing decoding circuitry may be made of two small decoders, one decoding the first set $Y_A$, and one decoding the second set $Y_B$. This occupies less semiconductor surface area and consumes less power than a large, e.g., eight-bit, decoder which could select bitlines BL with a single select gate per bitline.

An active signal on $Y_{A2}$ will render conductive transistors 70-2 in sub-circuits 84, 86, 88, connected to bitlines BL2, BL(p+2), BL(2p+2), but only one circuit, here 84, at a time will receive an active group select signal, here $Y_{B1}$, connecting bitline BL2 to the data line DB, leaving nodes 80 and the parasitic capacitances associated therewith in circuits 86, 88 holding residual charges due to the voltages of bitlines BL(p+2), BL(2p+2), respectively.

Similarly, while both select signals $Y_{A2}$ and $Y_{B0}$ are at a HIGH state, the node 80 of circuit 84 and any parasitic capacitance associated therewith will be charged to the signal level of bitline BL2. At the end of the select period, select signals $Y_{A2}$ and $Y_{B0}$ return to their LOW state. Transistors 70-2 and 82 cease to be conductive. Node 80 of circuit 84 is isolated, and hence also retains a residual charge, as no electrical conduction path is available for the charge to be eliminated.

Suppose that a subsequent select period begins, with select signals $Y_{A1}$ and $Y_{B0}$ being HIGH, and bitline BL1 LOW. (Corresponding to address 0000 0001.) Transistors 70-1 and 82 of circuit 84 become conductive. The bitline BL1 being at a LOW state, the node 80 and its associated parasitic capacitance must discharge the residual charge before a valid LOW signal is presented at DB. This means that a delay is introduced into the transmission of the bitline signal to dataline DB, slowing down operation of the memory device. Also, the data lines DB are charged to the value of the bitline signal and retain this charge when the select transistors become inoperative. At the next address cycle, this residual charge must be discharged if the next bitline accessed has a different state from the precedent.

In current flash EPROM devices, an address transition detect signal, such as the $\overline{ATD}$ signal discussed above, is generated, which produces a pulse at each change on the address bus. For the duration of this pulse, the address indicated in the address bus is changing, and so cannot be regarded as valid. No read or write operations are allowed during this time.

SUMMARY OF THE INVENTION

An object of the invention is to enable faster operation of memory devices.

Another object of the invention is to ensure that access times are substantially constant, that is, independent of the previously accessed data.

These objects are achieved by providing a circuit for addressing memory cells in a memory device, including two series connected select gates having a node between them, having a switching element connected between the node and a ground voltage, a control signal being applied to a control input of the switching element to render it conductive while both of the select gates are non-conductive. The control signal applied to the control input of the switching element may be the inverse of a control signal applied to the control input of one of the select gates. The control signal is preferably applied to the control input of the switching element every time that a different memory cell is to be addressed.

The invention is particularly applicable to flash memory devices including an array of single transistor memory cells, notably wherein each of the single transistor memory cells has a floating gate.

A method of controlling access to data in a memory device is also provided, which comprises the steps of:
applying inactive control signals to control inputs of select gates;
applying active control signals to the control inputs of chosen select gates so as to render them conductive;

causing the voltages present on bitlines to be conducted through the select gates which are receiving an active control signal, towards a dataline;
returning all select gate control signals to an inactive state;
providing an electrically conductive path from a node between two select gates to a ground voltage;
removing the electrically conductive path.

BRIEF DESCRIPTION OF THE DRAWINGS

A particular embodiment of the current invention will be described, by way of example, with reference to the accompanying diagrams.

DESCRIPTION OF THE PREFERRED EMBODIMENT

Figure 1:
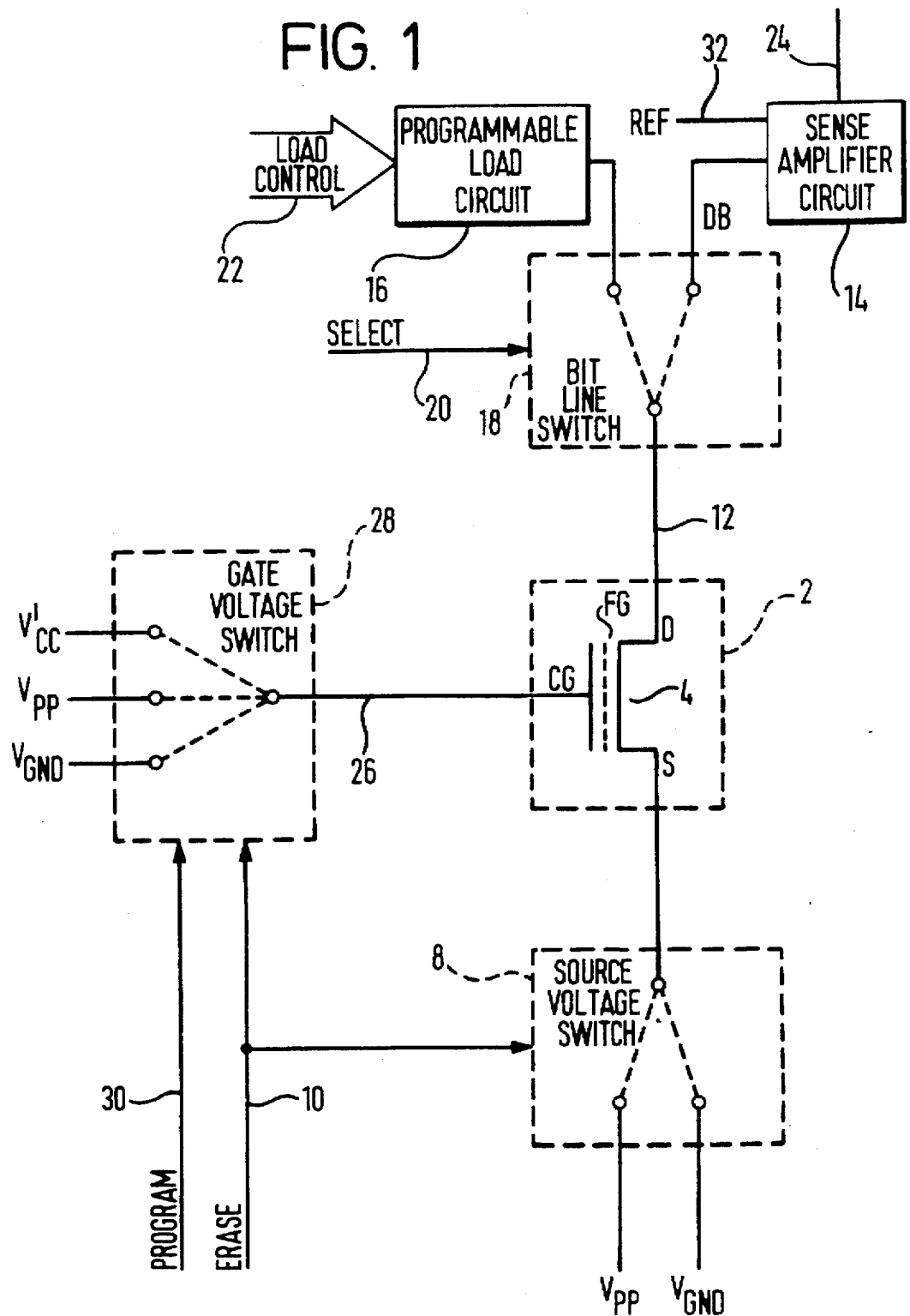
FIG. 1 shows circuitry for controlling a memory cell, according to the prior art.
Figure 2:
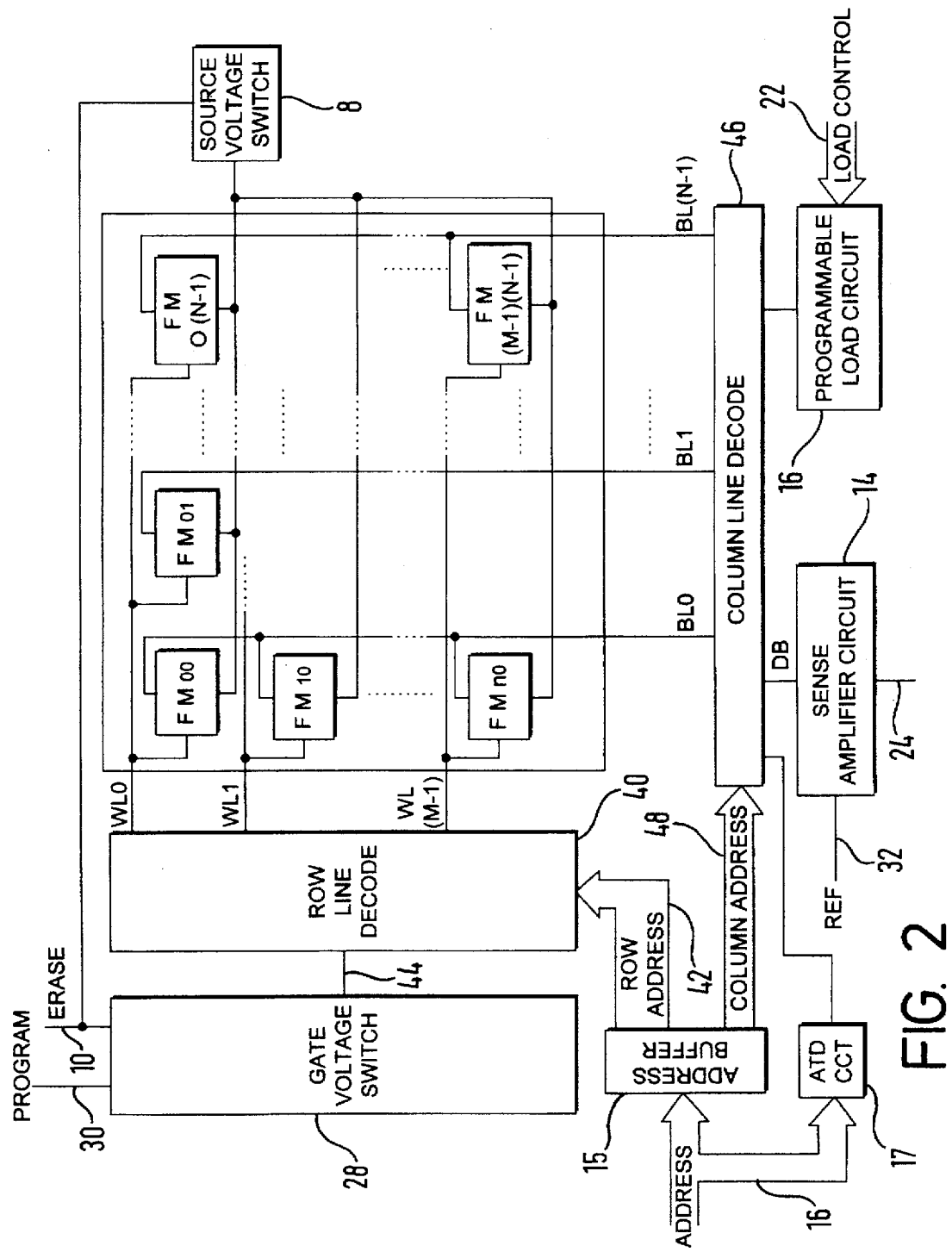
FIG. 2 shows a circuit diagram of a memory device known incorporating a plurality of cells such as that in FIG. 1.
Figure 3A:
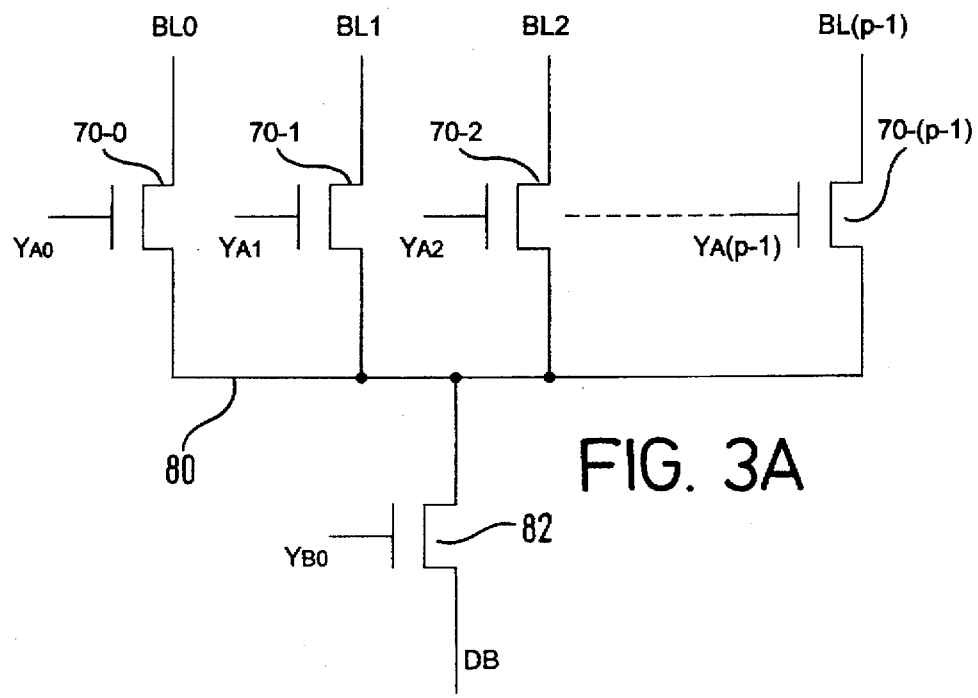
FIG. 3A is a circuit diagram of a part of a known memory device addressing circuit.
Figure 3B:
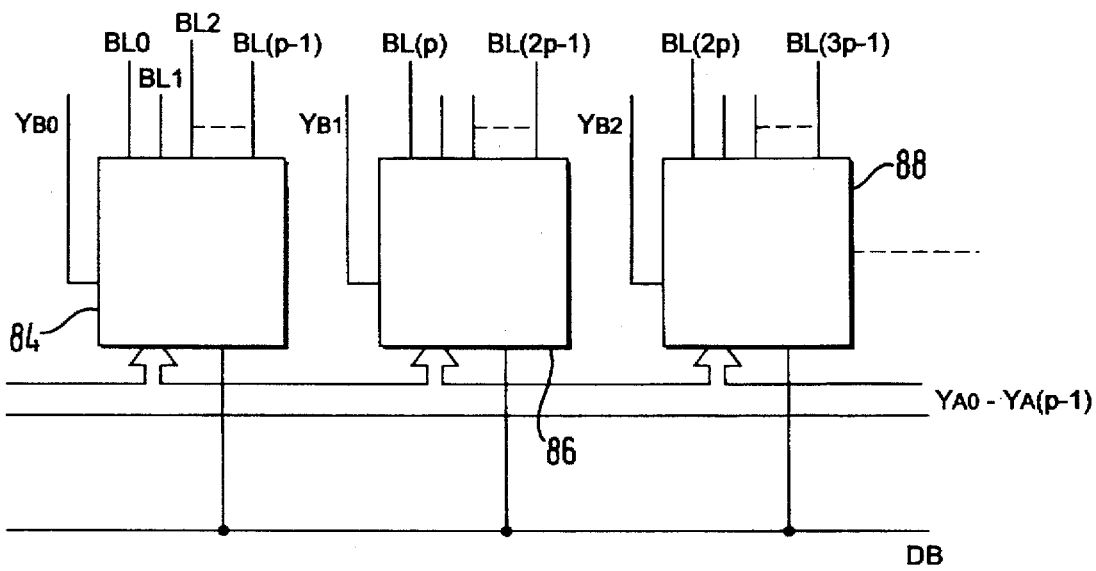
FIG. 3B is a circuit diagram of a larger part of the known memory device addressing circuit, including several circuits such as that of FIG. 3A.
Figure 4:
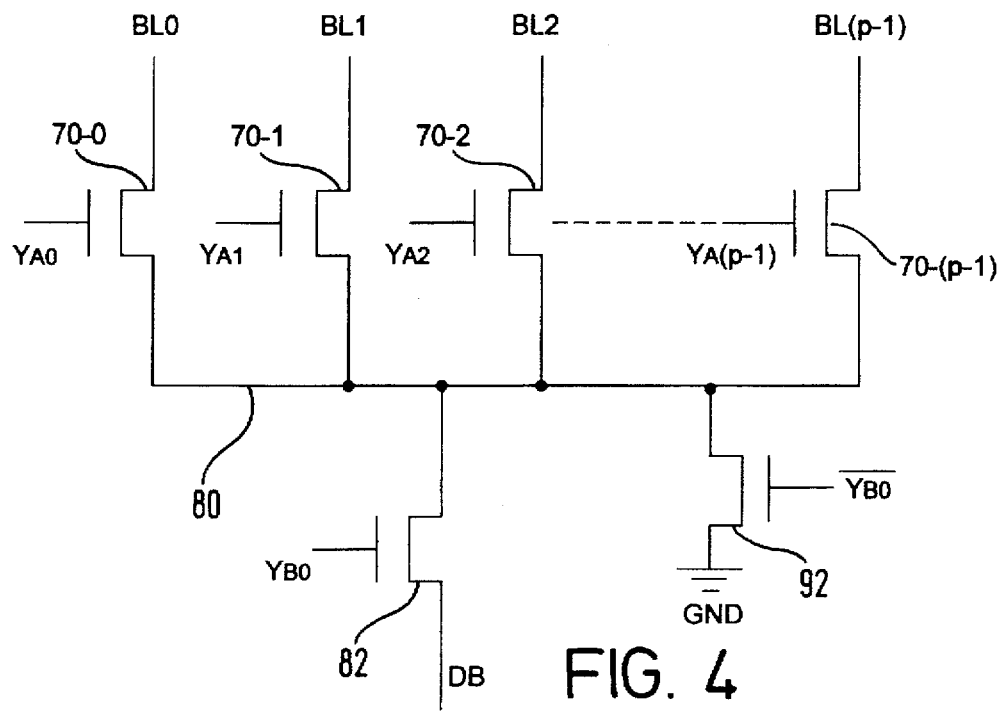
FIG. 4 is a circuit diagram of a part of a memory device addressing circuit according to a first embodiment of the invention.

FIG. 4 shows the circuit of FIG. 3 adapted according to the invention. N-channel transistor 92 is connected between node 80 and a ground voltage GND. This transistor 92 receives a signal $\overline{Y}_{B0}$ on its gate terminal, this signal being the inverse of the signal $Y_{B0}$ applied to the gate terminal of transistor 82.

During a select period where both $Y_{B0}$ and one of $Y_{A0}$ to $Y_{A(p-1)}$ are active, node 80 will be charged to the voltage of the logic level on the associated bitline. During this time, $Y_{B0}$ will be HIGH, to render transistor 82 conductive. The transistor 92 will be non-conductive, as its gate receives a LOW signal, $\overline{Y}_{B0}$.

At the end of the select period, the signal $Y_{B0}$ will become LOW, transistor 82 will become non-conductive and the electrical conduction path between the bitline BL and dataline DB is interrupted. At the same time, signal $\overline{Y}_{B0}$ will become HIGH, and transistor 92 will become conductive. This will cause any residual charge stored at node 80 to be conducted to ground, GND. Node 80 will then be at a fixed voltage, GND, by the time that the next select period begins. No residual charge will be present at the next select period, so no delay is introduced by the need to discharge a residual charge. Access time is thus reduced.

An improvement may be made by ensuring that the transistor 82 is rendered conductive at every address transition.

Figure 5:
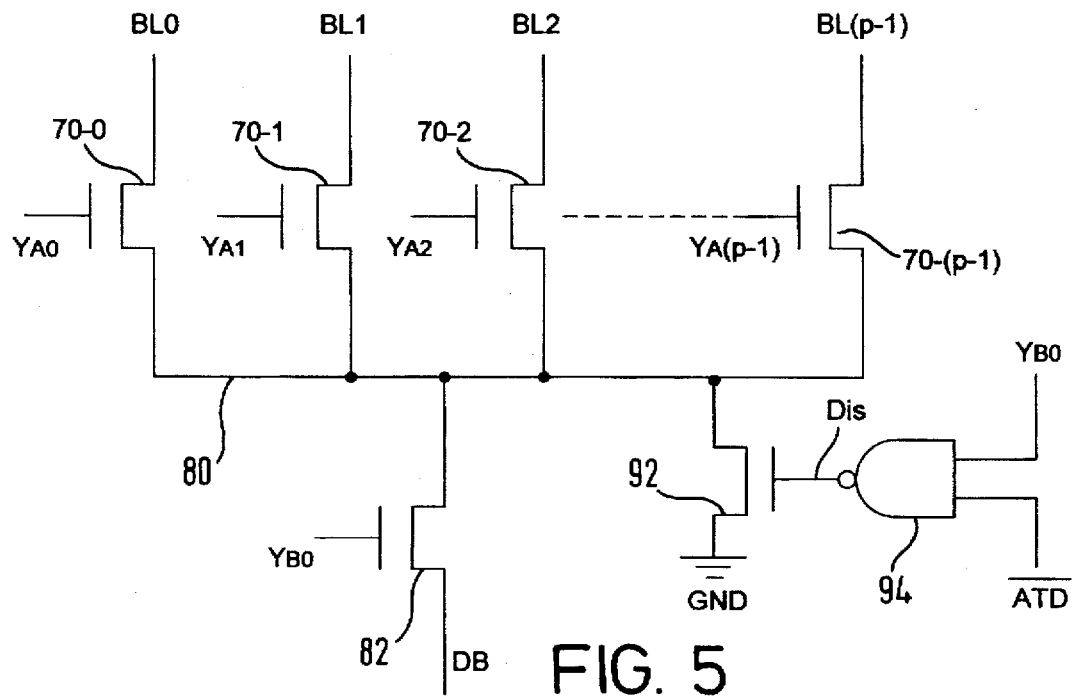
FIG. 5 is a circuit diagram of a part of a memory device addressing circuit according to a second embodiment of the invention.

FIG. 5 shows the improved circuit. NAND gate 94 has an output Dis connected to the gate of transistor 92. The NAND gate 94 has two inputs, the first of which receives the signal $Y_{B0}$; the second receives an active-LOW address transition detect signal, $\overline{ATD}$, which is generated asynchronously at every address transition.

When at least one bit of an address changes state, there is a period during which the address cannot be regarded as valid. During this period, the ATD signal is HIGH, and the $\overline{ATD}$ signal is LOW.

The discharging transistor 92 receives an active gate signal, and is thus rendered conductive, when either $Y_{B0}$ is inactive (LOW), or when the address transition detect signal $\overline{ATD}$ is active (LOW). Therefore, the improved circuit reacts immediately to an address transition to discharge the node 80. Such use of the address transition detect signal ensures that residual charge is not a problem between two access cycles which both have $Y_{B0}$ active. The access time in such situations is thus rendered more constant. During the time that $\overline{ATD}$ is active, no access is possible, as the new address is valid only at the end of the $\overline{ATD}$ pulse. Thus, the period may be used for ensuring that node 80 is in a known state, even if $Y_{B0}$ remains active through consecutive address cycles.

Figure 6A:
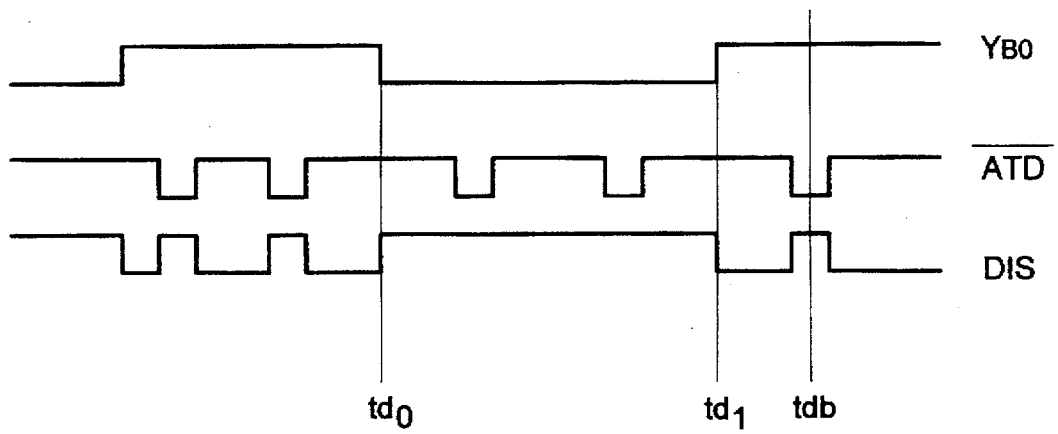
FIG. 6A is a timing diagram showing signals used in a first subcircuit according to the second embodiment of the invention.

FIG. 6A shows a timing diagram for the derivation of the signal Dis from the group select signal $Y_{B0}$ and the address transition detect signal $\overline{ATD}$. The Dis signal is HIGH, rendering the transistor 92 conductive and discharging any charge stored at node 80 whenever either $Y_{B0}$ or $\overline{ATD}$ is LOW, i.e., during any time that the node 80 may be isolated, and at any time that an address change is detected.

The circuit of FIG. 5, when operated according to the timing diagram of FIG. 6A, has the added advantage that, at times such as $t_{db}$, when both $Y_{B0}$ and Dis are high, a conduction path exists between the data line DB and ground GND, via transistors 82 and 92. Both node 80 and data line DB are thus discharged between successive addressing cycles.

During such times as $t_{d0}$ to $t_{d1}$, another subcircuit is connected to the dataline, for example circuit 86 may be enabled by signal $Y_{B1}$.

Figure 6B:
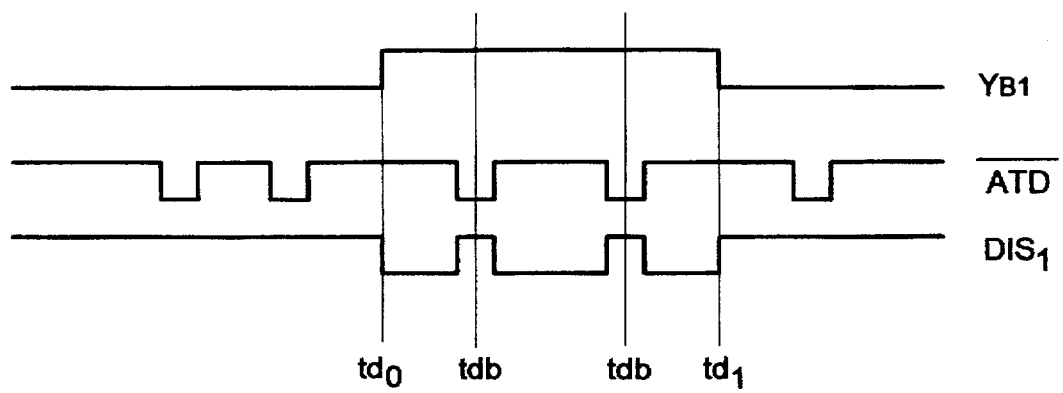
FIG. 6B is a timing diagram showing signals used in a second subcircuit according to the second embodiment of the invention.

FIG. 6B shows a timing diagram, similar to that of FIG. 6A, for the operation of the residual charge elimination transistor 92 of circuit 86. The enable signal $Y_{B1}$ is active from time $t_{d0}$ to time $t_{d1}$. During this time, two address changes occur, indicated by two pulses on $\overline{ATD}$. At each of these times $t_{db}$, a conductive path is open between the data line DB and the ground voltage GND. As one of the enable signals $Y_{B0}$-$Y_{B(p-1)}$ is active at each transition, the data line is discharged after each addressing cycle.

The discharging of the data line also means that no stored charge needs to be conducted to ground before a low value on an addressed bit line is properly transferred to the data line, again meaning a more regular and quicker transmission time, itself leading to a reduced access time of the memory device as a whole.

When a conduction path is established between a bitline BL and dataline DB, at the next select period, the access time will not be affected by the need to discharge any residual charge remaining at node 80, as this node is always at ground voltage whenever a new select period begins. The access time is thereby reduced, and rendered constant.

The invention thus achieves its objective by providing a circuit and method enabling faster operation of the memory device, ensuring that access times are substantially constant, regardless of the value of previously accessed data. The charge elimination is performed asynchronously, so that a next clock pulse is not awaited, allowing fastest possible operation. In the addressing circuit of a memory, the invention also provides for the discharging of data lines between addressing cycles, further contributing to improving the speed of operation oft he memory device.

Although the invention has been described in relation to the specific example of an addressing method for use in electronic memory devices, the invention finds application in all circuits where charge may inadvertently be stored at a node by disconnection of all conductive paths to that node.

I claim:

1. A circuit for addressing memory cells in a memory device, including two series connected select gates having a node between them, and a switching element connected between the node and a ground voltage, a control signal being applied to a control input of the switching element every time that a different memory cell is to be addressed to render the switching element conductive while both of the select gates are non-conductive to permit residual charge on the node between the select gates to be discharged.

2. A circuit according to claim 1 wherein the control signal applied to the control input of the switching element is the inverse of a control signal applied to the control input of one of the select gates.

3. A circuit according to claim 1 wherein the memory device is a flash memory device including an array of single transistor memory cells.

4. A circuit according to claim 1 wherein each of the single transistor memory cells has a floating gate.

5. A circuit for addressing memory cells in a memory device, comprising two series connected select gates having a node between them, a switching element connected between the node and a ground voltage, and a control input to the switching element for receiving a control signal every time that a different memory cell is to be addressed to render the switching element conductive, whereby said switching element is conductive when both of said select gates are non-conductive.

6. A circuit for addressing memory cells in a memory device including a plurality of subcircuits, each containing; two series connected select gates having a node between them, each select gate providing a conductive path between two main terminals when a control signal is applied to a control terminal, the main terminals of a first select gate being connected to the node and a common data line, a switching element being connected between the node and the ground voltage, a control signal being applied to a control input of the switching element to render it conductive, wherein an active control signal is present on the control terminal of the second select gate of at least one subcircuit and the control signal is applied to the control input of the switching element of each subcircuit each time that a memory cell is addressed, in order to establish a conductive path between the ground voltage, the node of each subcircuit, and the common data line.

7. A method of addressing memory cells in a memory device, including the steps of:

applying inactive control signals to control inputs of select gates connected to respective bit lines;

applying active control signals to the control inputs of chosen select gates connected to respective bit lines so as to render the chosen select gates conductive;

causing the voltages present on bitlines to be conducted through the select gates which are receiving an active control signal, towards a dataline;

returning at least one of the chosen select gate control signals to an inactive state;

providing an electrically conductive path from a node between the chosen select gates to a ground voltage via a switching element each time said select gates are returned to an inactive state to permit residual charge at the node to be discharged;

removing the electrically conductive path.

8. The method of claim 7 wherein said step of returning the chosen select gate control signals to an inactive state follows an address transition.

9. A method of addressing single transistor, floating gate memory cells in a flash EPROM memory device, including the steps of:

applying inactive control signals to control inputs of select gates connected to respective bit lines;

applying active control signals to the control inputs of chosen select gates connected to respective bit lines so as to render the chosen select gates conductive;

causing the voltages present on bitlines to be conducted through the select gates which are receiving an active control signal, towards a dataline;

returning select gate control signals to an inactive state;

providing an electrically conductive path from a node between two select gates to a ground voltage each time the chosen select gates are returned to an inactive state to thereby permit residual charge on the node to be discharged;

removing the electrically conductive path.

10. A circuit as claimed in claim 1 wherein said control signal is provided by an address transition detection circuit every time an address transition is detected.

11. A circuit as claimed in claim 5 wherein said control signal is provided by an address transition detection circuit every time an address transition is detected.

12. A circuit for addressing memory cells in a memory device comprising:

a plurality of first select gates connected in parallel, each of said first gates being connectable to a respective bit line;

a second select gate connected in series with said plurality of first select gates;

a switching element connected to ground and a node between said first select gates and said second select gate, a control signal being arranged to be applied to a control input of the switching element to render it conductive each time said first select gates and said second gate become non-conductive to permit residual charge between the select gates to be discharged.

13. A circuit as claimed in claim 12 wherein an address transition detection circuit is arranged to provide the control signal to control said switching element, said control signal being provided each time a transition in an input address is detected.

14. A circuit as claimed in claim 12 wherein the control signal applied to said switching element is the inverse of a control signal used to control the operation of said second gate.

15. A circuit for addressing memory cells in a memory device comprising:

a plurality of groups of first select gates, the select gates of each group being connected in parallel and each first gate being connectable to a respective bit line;

a plurality of second select gates, each second gate being connected in series with a respective group of first select gates;

a plurality of switching elements, each switching element being connected to ground and a node between a respective group of first gates and the second gate connected to said respective group of first gates, a control signal being arranged to be applied to a control input of the switching element each time the respective group of first gates and the second gate become nonconductive to permit residual charge between the first and second gates to be discharged.

16. A circuit for addressing memory cells in a memory device comprising:

a plurality of first select gates connected in parallel, each of the first select gates being connectable to a respective bit line;

a second select gate connected in series with said plurality of first select gates;

a switching element connected to ground and to a node between the first select gates and the second select gate, said switching element being arranged to receive a control signal to render said switching element conductive;

means for providing said control signal between each read operation, said control signal being provided when an address transition is detected such that the switching element permits residual charge on the node between the first and second select gates after each read operation to be discharged.

* * * * *